(12) United States Patent
Gruen

(10) Patent No.: US 7,368,658 B1
(45) Date of Patent: May 6, 2008

(54) HIGH EFFICIENCY DIAMOND SOLAR CELLS

(75) Inventor: Dieter M. Gruen, Downers Grove, IL (US)

(73) Assignee: The United States of America as represented by the United States Department of Energy, Washington, DC (US)

(*) Notice: Subject to any disclaimer, the term of this patent is extended or adjusted under 35 U.S.C. 154(b) by 794 days.

(21) Appl. No.: 10/697,048

(22) Filed: Oct. 31, 2003

(51) Int. Cl.
*H01L 31/0256* (2006.01)
(52) U.S. Cl. .................................. 136/258; 136/252
(58) Field of Classification Search ............. 136/263, 136/252, 258
See application file for complete search history.

(56) References Cited

U.S. PATENT DOCUMENTS 6,753,469 B1 * 6/2004 Kolawa et al. ............ 136/253
6,793,849 B1 * 9/2004 Gruen et al. ................ 252/502

* cited by examiner

*Primary Examiner*—Nam Nguyen
*Assistant Examiner*—Jeffrey Barton
(74) *Attorney, Agent, or Firm*—Bradley W. Smith; Mark P. Dvorscak; Paul A. Gottlieb

(57) ABSTRACT

A photovoltaic device and method of making same. A layer of p-doped microcrystalline diamond is deposited on a layer of n-doped ultrananocrystalline diamond such as by providing a substrate in a chamber, providing a first atmosphere containing about 1% by volume $CH_4$ and about 99% by volume $H_2$ with dopant quantities of a boron compound, subjecting the atmosphere to microwave energy to deposit a p-doped microcrystalline diamond layer on the substrate, providing a second atmosphere of about 1% by volume $CH_4$ and about 89% by volume Ar and about 10% by volume $N_2$, subjecting the second atmosphere to microwave energy to deposit a n-doped ultrananocrystalline diamond layer on the p-doped microcrystalline diamond layer. Electrodes and leads are added to conduct electrical energy when the layers are irradiated.

14 Claims, 1 Drawing Sheet

HIGH EFFICIENCY DIAMOND SOLAR CELLS

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

BACKGROUND OF THE INVENTION

The efficient conversion of solar energy into electricity has been a major goal of the global search for renewable energy sources. Considerable progress has been made in this search with the development of photovoltaic devices based on silicon (Si). The Si solar cell depends on the fabrication of p-n junctions usually produced by doping Si with B (p-type) and with P (n-type). Single crystal Si, polycrystalline Si, or amorphous hydrogenated Si can be employed. With the latter material, thin film ~1 μm thick cells can be constructed because of the high absorption coefficient of amorphous Si for solar radiation compared to crystalline Si. Solar cells based on Si have a theoretical conversion efficiency of 22%. However, various loss factors prevent one from reaching the theoretical efficiency and thin film cells generally have conversion efficiencies of 5-8%. One of the principal reasons for the low conversion efficiency is the fact that the band gap of Si is ~1 ev. Solar photons with energies less than 1 ev are not effective in generating an electrical current. On the other hand, photons with energies higher than 1 ev appear to generate no more than one electron-hole pair so that much of the excess energy is degraded to lattice vibrational energy and appears as heat. To improve cell performance, composite cells have been developed consisting of several materials stacked one on top of the other. The variation in the band gaps of these materials allows selective absorption of photons of different energies to occur so that the overall efficiency of such a composite cell is increased. Fabrication of such composite cells of course increases the cost of the devices considerably.

An intensive search has been made during the last twenty years for materials that would allow one to increase the photon to electricity conversion efficiency without adding substantially to the cost of the photovoltaic cells. A material for this purpose ideally would have the property of making optimal use of photons with energies spanning the solar spectrum on the surface of the earth, that is to say photon energies in the range of 0.5-5 ev. To make use of the solar photons, the material must have a high absorption coefficient over the entire solar spectral range. The material should have a wide band gap of 5-6 ev, be electrically conducting, and be capable of being doped both n and p type. Furthermore, the electronic structure and the electron-photon coupling must be such as to allow the creation of electron-hole pairs which are effective in sustaining an electric current with good quantum efficiency over the whole solar spectral range. Considering the stringent materials requirements which have just been enumerated, it is not surprising that no material has been found up to now which satisfies all of the above named criteria.

The present invention is a new photovoltaic device based on carbon in the form of diamond which can function as a high efficiency solar cell and a method of making same. The discovery, development characterization and uses of ultrananocrystalline diamond films (UNCD) that is diamond having average diameters in the range of from about 3 nanometers to about 15 nanometers has been the subject of a number of earlier patents, such as U.S. Pat. No. 5,989,511, and Ser. No. 10/398,329 filed Apr. 4, 2003, the disclosures of which are herein incorporated by reference, teach the nitrogen doping of UNCD films to enhance the electrical conductivity and therefore the electron emission and electrochemical properties of UNCD. The nature of the carriers giving rise to the conductivity has been found to be n-type by Hall effect measurements.

SUMMARY OF THE INVENTION

Accordingly, it is an object of the present invention to provide a new high efficiency carbon based photovoltaic material.

Another object of the present invention is to provide a photovoltaic conversion device and laminate in which abutting layers of both p-doped diamond and n-doped nanocrystalline diamond provides the required electron flow between layers upon irradiation.

Yet another object of the present invention is to provide a high efficiency wide band gap electrically conducting material capable of being doped with both n and p types.

Still another object of the present invention is to provide a photovoltaic conversion device, comprising abutting layers of p-doped diamond and n-doped ultrananocrystalline diamond, whereby irradiation of at least one of the diamond layers produces electron flow between the layers.

A further object of the present invention is to provide a photovoltaic device, comprising a layer of p-doped microcrystalline diamond, a layer of n-doped ultrananocrystalline diamond deposited on the layer of p-doped microcrystalline diamond, irradiation of the n-doped ultrananocrystalline diamond layer producing electron flow therebetween, and electrodes connected to each layer.

Yet another object of the present invention is to provide a method of producing a photovoltaic device, comprising providing a substrate in a chamber, providing a first atmosphere containing about 1% by volume $CH_4$ and about 99% by volume $H_2$ with dopant quantities of a boron compound, subjecting the atmosphere to microwave energy to deposit a p-doped microcrystalline diamond layer on the substrate, providing a second atmosphere of about 1% by volume $CH_4$ and about 89% by volume Ar and about 10% by volume $N_2$, subjecting the second atmosphere to microwave energy to deposit a n-doped ultrananocrystalline diamond layer on the p-doped microcrystalline diamond layer, and providing leads to conduct electrical energy when the layers are irradiated.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
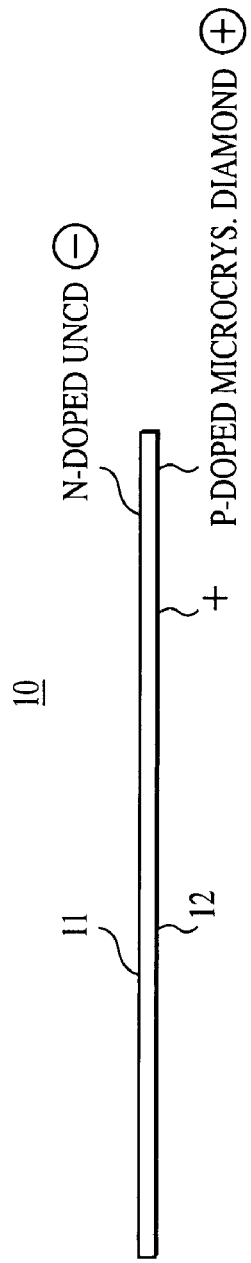
FIG. 1 is a laminate incorporating the present invention.

It has been known for a long time that microcrystalline CVD diamond films can be doped p-type with boron (B). Other p-type dopants are materials having a stable valence state of less than four, such as Al, Ga and In. However, n-type doping was not possible until the discovery of UNCD because the introduction of N, an n-type dopant into the grain-boundaries of UNCD requires 5 ev less energy than placing N into a substitutional site in the bulk lattice. Other n-type dopants are materials having stable valence states of greater than four, such as P, As, Sb and S. The grain boundaries in 3-5 nm UNCD are ubiquitous. About 10% of the carbon atoms in the film are at grain boundaries where they are three coordinated to about a 50% fraction. The $sp^2$ bonded carbons introduce many states into the 5.5 ev band gap of diamond. Nitrogen dopant atoms, along with hydrogen atoms in the grain boundaries, modify the electronic structure of the grain boundary so as to increase the fraction of $sp^2$ bonded carbons; to introduce nitrogen doping levels near the diamond conduction band; to introduce delocalized states between 1-2 ev above the valence band of diamond; to introduce other N levels both below and above the Fermi Level; to form $sp^2$ sub-bands. The concentration of grain boundaries in UNCD is such as to exceed the percolation limit giving conductivity values that rival the conductivity of graphite with temperature behavior which can be described as semi-metallic. The light absorption coefficient of UNCD is very high in the 0.5-5 ev region—so high in fact that 1 μm thick UNCD films are essentially totally absorbing to an extent of about 95%. The ability to n-type dope diamond in the form of UNCD makes possible the fabrication of diamond p-n junctions by growing n-doped UNCD layers on p-doped microcrystalline diamond.

An aspect of the basic invention is to grow boron doped microcrystalline diamond for example from a microwave discharge is 1% $CH_4$-99% $H_2$ containing a small amount of diborane or another boron compound. After a suitable thickness of microcrystalline diamond film has been grown, the gas mixture is replaced with one containing 1% $CH_4$-89% Ar-10% $N_2$. Nitrogen doped UNCD on top and in intimate contact with boron doped microcrystalline diamond provides a p-n junction. Irradiation with a solar photon flux row turns this device into a diamond based photovoltaic cell. The efficient production of long lived electron-hole pairs leads to a highly efficient solar cell which makes excellent use of the entirety of the solar spectrum. The unique electronic structure of the UNCD grain boundaries allows n-type doping and high electrical conductivity of ultrananocrystalline diamond to be achieved, thus making possible the creation of diamond based solar cells.

As disclosed in the copending and incorporated patent applications previously identified, nitrogen or n-doped UNCD films may be synthesized using a microwave plasma CVD technique with a $CH_4$/Ar $N_2$ gas mixture. Other carbon containing gases are also applicable, as well as other deposition methods and other noble gases. Morphology and transport properties of the films are both greatly affected by the presence and amount of the CN in the plasma, which varies as nitrogen gas is added. The data set forth in the incorporated patent applications indicate that the grain size and grain band width of the n-doped UNCD films increase with the addition of nitrogen in the plasma. In general, nitrogen doped UNCD films have been made by CVD microwave processes with gas mixtures of Ar/$CH_4$ (1%-2%)/N (1-20%) at total pressures of 100 torr and 800 watts of microwave power while the substrates were maintained at temperatures of from about 350° C. to about 800° C. In addition, n-doped UNCD films may be produced by using up to 2% by volume methane or a precursor thereof or $C_2H_2$ or a precursor thereof or a $C_{60}$ compound. In general, the n-doped UNCD material has not less than $10^{19}$ atoms/cm$^3$ nitrogen with an electrical conductivity at ambient temperature of not less than about 0.1 $(\Omega \cdot cm)^{-1}$. The ultrananocrystalline diamond has grain boundaries that are about 0.2 to about 2.0 nm wide and the average grain size for ultrananocrystalline diamond is less than about 15 nm and preferably less than 10 nm and most preferably in the range of between about 3 and about 10 nm. The electrical conductivity of n-doped UNCD films has been measured at greater than 100 $(\Omega cm)^{-1}$.

In general, thin film solar cells are well known in the art and are disclosed in a large number of patents, such as U.S. Pat. No. 6,452,092 issued to Han et al. Sep. 17, 2002; U.S. Pat. No. 6,525,264 issued to Ouchida et al. Feb. 25, 2003 and U.S. Pat. No. 5,578,502 issued to Albright et al. Nov. 26, 1996, the entire disclosures of which are herein incorporated by reference. The laminate and solar cell of the present invention are disclosed in FIGS. 1 and 2 and reference to those figures show a laminate 10 consisting of an n-doped UNCD layer 11 deposited on a p-doped microcrystalline diamond layer 12. As before mentioned, the n-doped nanocrystalline diamond may be doped with any material having a stable valence state of greater than 4 and while preferably with nitrogen, alternate materials such as P, S and As may be used. The layer 11 may be from about 1 micron to about 5 microns in thickness and have an average grain size of up to about 15 nanometers, preferably the grain size is less than about 10 nm and most preferably in the range of from about 3 nm to about 15 nm. The p-doped microcrystalline diamond as disclosed, is a boron doped material usually added to the vapor as a borate or a diborane, but may be a number of materials having a stable valence state of less than 4. Although boron is preferred, materials such as Al, Ga, or In are alternate dopants for the p-doped diamond material, which as previously noted, is preferably a microcrystalline diamond having grain average sizes from the range of about 1 micron to about 10 microns and more preferably in the range of from about 1 micron to about 5 microns with a thickness of preferably less than about 5 microns and most preferably in the range of from about 1 micron to about 5 microns.

Figure 2:
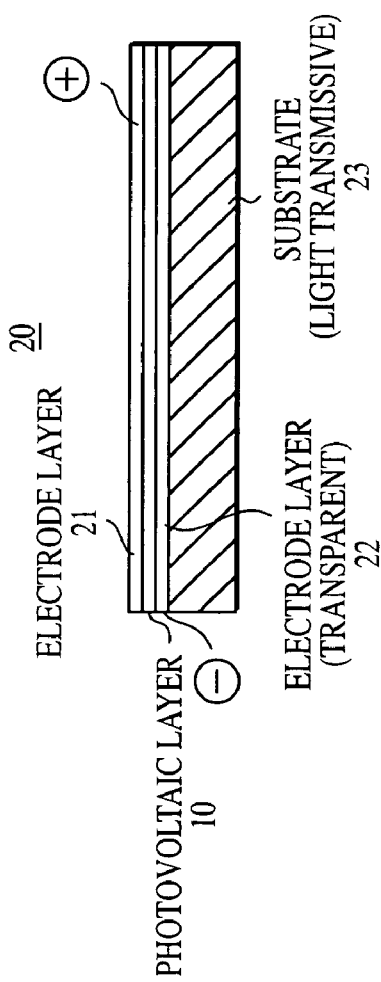
FIG. 2 is a schematic illustration of a photovoltaic cell incorporating the present invention.

As seen in FIG. 2, a thin film solar cell 20 includes but is not limited to a light transmissive substrate 23 having placed thereon a laminate 10 of the type previously described with an electrode layer 21 in contact with the p-doped microcrystalline layer 12 and an electrode layer 22 in contact with the n-doped ultrananocrystalline layer 11. Suitable connections are made to electrodes 21 or 22 to complete the solar cell which is connected as is well known to an energy storage device. The transparent front electrode 22 may be of any well known material such as tin oxide. The electrode layer 21 may be made of any other well known solar cell electrode material such as silver or zinc oxide or a wide variety of materials. The photovoltaic efficiency of the photovoltaic device or cell 20 is very high due to the high band gap of the n-doped ultrananocrystalline material, and accordingly, the solar cell made in accordance with the present invention using the methods herein described is a significant advance in the art compared to the efficiency of presently available photovoltaic cells.

While there has been disclosed what is considered to be the preferred embodiment of the present intention, it is understood that various changes in the details may be made without departing from the spirit, or sacrificing any of the advantages of the present invention.

What is claimed is:

1. A multilayered device capable of converting solar energy to electrical energy comprising:
    a substrate layer which is transparent to an incident beam of electromagnetic radiation where said electromagnetic radiation encompasses radiation which makes up a solar spectrum;
    a first electrode layer which is positioned adjacent to said substrate and which is transparent to said incident electromagnetic radiation;
    abutting layers of a p-doped microcrystalline diamond layer and an n-doped ultrananocrystalline diamond layer to provide a p-n junction where said first electrode layer is in contact with said n-doped layer, and where irradiation by said electromagnetic radiation of at least one of said diamond layers produces electron flow between said layers
    a second electrode layer which overlays and is in contact with said p-doped layer.

2. The photovoltaic device of claim 1, wherein said p-doped microcrystalline diamond is microcrystalline diamond with average grain size in the range of from about 1 micron to about 10 microns.

3. The photovoltaic device of claim 1, wherein said p-doped microcrystalline diamond layer is microcrystalline diamond having a thickness in the range of from about 1 micron to about 5 microns.

4. The photovoltaic device of claim 1, wherein said p-doped microcrystalline diamond is doped with a material having a stable valence state less than four.

5. The photovoltaic device of claim 4, wherein said p-doped microcrystalline diamond is microcrystalline diamond doped with one or more of B, Al, Ga or In.

6. The photovoltaic device of claim 5, wherein said p-doped diamond is microcrystalline diamond doped with B.

7. The photovoltaic device of claim 1, wherein said n-doped ultrananocrystalline diamond is doped with a material having a stable valence state greater than four.

8. The photovoltaic device of claim 1, wherein said n-doped ultrananocrystalline diamond has average grain size in the range of from about 3 nanometers to about 15 nanometers.

9. The photovoltaic device of claim 8, wherein said n-doped ultrananocrystalline diamond has average grain size of less than about 10 nanometers.

10. The photovoltaic device of claim 1, wherein said n-doped ultrananocrystalline diamond is doped with one or more of N, P, Sb or S.

11. The photovoltaic device of claim 1, wherein said n-doped ultrananocrystalline diamond is doped with N.

12. The photovoltaic device of claim 1, wherein said n-doped ultrananocrystalline diamond layer has not less than $10^{19}$ atoms/cm$^3$ nitrogen with an electrical conductivity at ambient temperature of not less than about 0.1 $(\Omega cm)^{-1}$.

13. The photovoltaic device of claim 12, wherein said n-doped ultrananocrystalline diamond has grain boundaries that are about 0.2 to about 2.0 nm wide.

14. The photovoltaic device of claim 1, wherein said n-doped ultrananocrystalline diamond layer has a thickness in the range of from about 1 micron to about 5 microns.

* * * * *